United States Patent
Sale et al.

(10) Patent No.: US 9,465,904 B2
(45) Date of Patent: Oct. 11, 2016

(54) DEVICE PIN MUX CONFIGURATION SOLVING AND CODE GENERATION VIA BOOLEAN SATISFIABILITY

(71) Applicant: Texas Instruments Incorporated, Dallas, TX (US)

(72) Inventors: Darian Robert Peter Sale, Toronto (CA); Mandeep Singh Deol, Brampton (CA); Paul Ian Strathdee Marshall, Lucas, TX (US); Paul Arthur Gingrich, Toronto (CA); Shing Fu Pang, Toronto (CA); Victor Xi Yang, Richmond Hill (CA); Andrew Edward Waterson, Pickering (CA); Steven Derrick Clynes, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/665,551

(22) Filed: Mar. 23, 2015

(65) Prior Publication Data
US 2015/0278423 A1 Oct. 1, 2015

Related U.S. Application Data

(60) Provisional application No. 61/972,676, filed on Mar. 31, 2014.

(51) Int. Cl.
G06F 17/50 (2006.01)
(52) U.S. Cl.
CPC ....... *G06F 17/5077* (2013.01); *G06F 17/5081* (2013.01); *G06F 17/5068* (2013.01)
(58) Field of Classification Search
CPC .............. G06F 17/5068; G06F 17/5077; G06F 17/5081
See application file for complete search history.

(56) References Cited

U.S. PATENT DOCUMENTS

| | | | | |
|---|---|---|---|---|
| 6,038,381 A * | 3/2000 | Munch | ................ | G06F 17/5045 703/18 |
| 6,415,430 B1 * | 7/2002 | Ashar | .................. | G06F 17/504 703/15 |
| 7,062,726 B2 * | 6/2006 | Andreev | ............ | G06F 17/5045 716/104 |
| 7,295,037 B2 * | 11/2007 | Schmit | ............ | H03K 19/17796 326/38 |
| 7,342,415 B2 * | 3/2008 | Teig | ................. | H03K 19/17736 326/113 |
| 7,386,828 B1 * | 6/2008 | Safarpour | ........... | G06F 17/5027 716/105 |
| 7,831,943 B1 * | 11/2010 | Das | ..................... | G06F 17/5054 716/106 |
| 8,181,131 B2 * | 5/2012 | Baumgartner | ........ | G06F 17/504 716/103 |
| 8,984,464 B1 * | 3/2015 | Mihal | ................. | G06F 17/5072 716/118 |
| 2010/0057647 A1 * | 3/2010 | Davis | .................. | G06N 99/005 706/12 |

* cited by examiner

*Primary Examiner* — Naum B Levin
(74) *Attorney, Agent, or Firm* — Robert D. Marshall, Jr.; Frank D. Cimino

(57) ABSTRACT

This invention is a signal input/output design tool for integrated circuit input/output design. The connectivity capacity of at least multiplexer connecting internal signals and external lines is expressed as a first set of Boolean expressions. The desired connectivity between internal signals and external lines is expressed is provided by a designer. A programmed general purpose computer expresses the desired connectivity as a second set of Boolean expressions and determines whether said first set of Boolean expressions and said second set of Boolean expressions are Boolean satisfiable. If satisfiable, the design tool generates control signals to configure the at least one multiplexer to achieve the desired connectivity. If not satisfiable, the design tool generates a report indicating which portions of the desired connectivity are achievable and which are not.

6 Claims, 2 Drawing Sheets

DEVICE PIN MUX CONFIGURATION SOLVING AND CODE GENERATION VIA BOOLEAN SATISFIABILITY

CLAIM OF PRIORITY

This application claims priority under 35 U.S.C. 119(e)(1) to U.S. Provisional Application No. 61/972,676 filed Mar. 31, 2014.

TECHNICAL FIELD OF THE INVENTION

The technical field of this invention is integrated circuit input/output connection design.

BACKGROUND OF THE INVENTION

Processors are designed to meet a variety of needs. Because each separate design is expensive, it makes sense to maximize the available features of a processor so that it can be used in as many situations as possible. It is typically advantageous to design a digital data processor having a pin out not allowing use all of features of the integrated circuit. Many of the internal components of a processor need to be connected to external circuitry to be of use. The physical size of the integrated circuit and other considerations restricts the number of external pins that can be on a chip. Processors often have more internal signals than external pins. Thus internal signals are connected to a digital multiplexer to allow it to switch which signal it is connected to which external pin. The multiplexers can be configured at runtime.

This is not a problem if only a few signals need to be pinned out for a given application. However, if many signals are needed, it can be difficult to configure what signals are connected to what external pins.

Although a signal may be connected to more than one external pin, the connection cannot be arbitrary. Each multiplexer may only be connected to so many signals.

Only one internal signal may be connected to an external pin at a time.

Timing constraints for a group of internal signals may restrict what connections can be used at the same time.

Multiple different signals or components may be able to fulfill a specific need, and each one may have a different set of external pins it can be connected to.

As such, the number of possible permutations of signal to pin connections for a given application may be enormous. This makes it very difficult to find a valid combination, or to prove that a valid combination simply does not exist.

SUMMARY OF THE INVENTION

This invention is a signal input/output design tool for integrated circuit design. One set of Boolean expressions describes what the integrated circuit is physically capable of connecting. A second set of Boolean expressions describes the needs of the user. If there is a set of values such that all Boolean expressions are true, then the system is solved. This means there is a set of connections within the permitted connectively that satisfices the design goal. If not, then the designer's needs can't be met by the device. A programmed general purpose computer determines whether said first set of Boolean expressions and said second set of Boolean expressions are Boolean satisfiable.

If the two sets of Boolean expressions are satisfiable, then the connectivity capacity of the multiplexer can provide the desired connectivity. The solution of the Boolean satisfiability corresponds to the required connectivity of the multiplexer or multiplexers. The programmed general purpose computer can generate control signals for the multiplexer to achieve the desired connectivity. Depending upon the integrated circuit design, the multiplexer may be programmed once upon manufacture and remained fixed thereafter. Alternately, the multiplexer may be reprogrammed at run time to implement one of plural desired connectivities at a time.

If the two sets of Boolean expressions are not Boolean satisfiable, then the design tool may indicate what needs can't be fulfilled and which other needs prevent satisfiability. This may be achieved by iteratively removing Boolean expressions of said second set of Boolean expressions. The process then determines whether the first set of Boolean expressions and a current second set of Boolean expressions are Boolean satisfiable. If the altered second set of Boolean expressions is satisfiable, then this set of Boolean expression is marked as valid. If the altered second set of Boolean expressions is not satisfiable, then this set of Boolean expression is marked as invalid. It is invalid because the multiplexer or multiplexers cannot be configured to satisfy that Boolean expression.

Being able to definitively determine whether a desired multiplexer configuration is possible, may be a great advantage over current cut-and-try methods of design.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
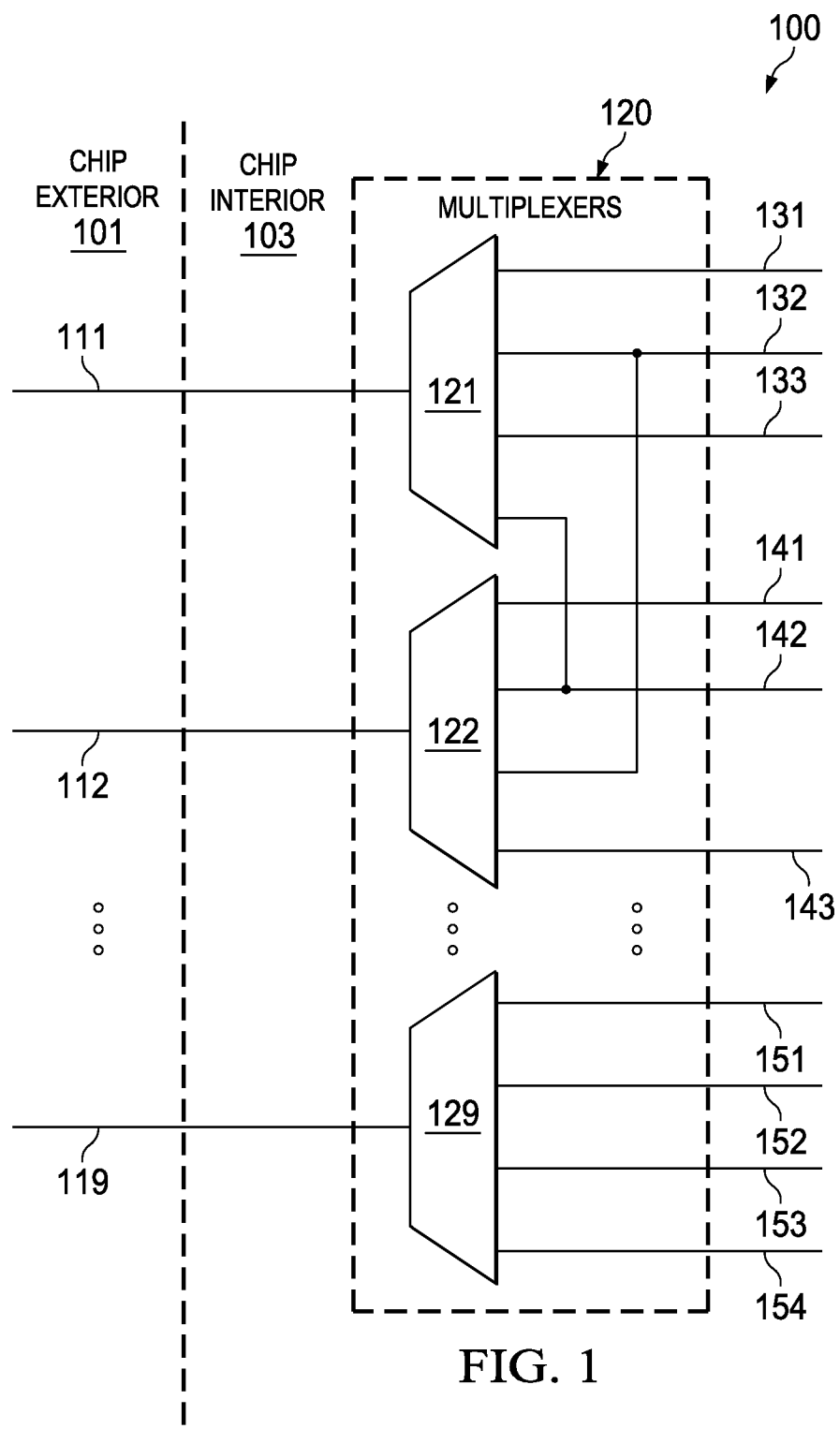
FIG. 1 illustrates a block diagram of an example of the signal multiplexers used in this invention.

This invention is a software design tool that allows a designer to input the needs of their system. This is different than inputting the signals needed by their system because there may be multiple signals that fulfill their needs.

Next, the design tool converts the needs into one or more choices of signal to use and one or more choices of what external pin the signal is to be connected to, based on what the processor provides and is capable of. These choices are enumerated and then expressed as a logical Boolean expression. Timing constraints on the signals are included in the Boolean expression.

Boolean satisfiability, or finding a set of assignments to variables in a Boolean expression that would make the expression true, is a well studied problem in computer science. The design tool of this invention uses a known algorithm for this domain to either prove that the expression can't be satisfied, or to find a set of assignments to the enumerated variables that would satisfy the expression. This set of assignments translates back into which signals to connect to which pins for the needs of this specific system.

If the Boolean expression cannot be satisfied, the design tool will remove all new Boolean constraints, and iteratively restore them individually. If an individual need is not satisfiable, then the tool marks this as an error. This is an error because that Boolean expression prevents the satisfaction of the design needs within the capability of the multiplexer or multiplexers. The design tool can then iteratively add removed constraints for other needs back in, and either mark them as an error or not depending on whether the Boolean expressions can be satisfied.

The designer who uses the tool is then presented with a set of needs that cannot be solved for. The designer may then either remove those needs or remove other needs that conflict with the available choices based on what choices would satisfy those needs.

As more needs are added, the same algorithm is re-run. However needs that were previously found to be conflicting, and newly added needs, are always removed first. This keeps the errors deterministic and prevents them from jumping around across needs.

Users can also deal with errors by selecting a specific signal/pin choice as opposed to letting the application find a choice. This may be because their system has specific external circuitry on one side of the chip and they want the external pin located as close to that as possible.

Lastly, the tool generates C source code that, when compiled as part of another application, would configure the processor to establish the connections previously solved for.

There are multiple existing tools that are used to aide in finding a multiplexer configuration for a given system such as the Texas Instruments Tiva™ C Series PinMux Utility. Such tools typically encapsulate knowledge of what is possible on the device and may also generate C code. Such tools typically do not attempt to find a valid configuration. These tools only allow the user to select signals and configure what the signal is connected to manually. These tools may indicate when two signals are trying to be connected to the same pin, or when a group of signals violates some timing constraint. These tools indicate what pins are available. But these tools will not try to find an alternate configuration or indicate that no possible solution exists.

Boolean satisfiability is also not a new concept. Many applications already make use of it. Boolean satisfiability is used for FPGA (Field Programmable Gate Array) signal routing to external pins. This differs from this invention because a FPGA can be entirely reprogrammed to re-route the signal as needed. For example, the internal end location could be moved to a different set of gates. The digital data processors of this invention contain a fixed set of multiplexers and signal end locations that cannot be changed. Those prior art tools generates FPGA layouts instead of source code to configure pre-existing multiplexers.

Boolean satisfiability can be explained with the following simplified example. Designate external pins as 1, 2, 3 . . . and designate internal signals as a, b, c . . . . Define 1a as the choice of connecting external pin 1 to internal signal a. Similarly, define 1b the choice of connecting external pin 1 to internal signal b. A similar terminology is used for other connections. If the individual multiplexer connected to external line 1 may be multiplexed to internal signals a or b, then the following Boolean expressions represent that:
 1a OR 1b
 NOT (1a AND 1b)
The first Boolean expression (1a OR 1b) states that one of internal signals a or b must be connected to external pin 1. The second Boolean expression (NOT (1a AND 1b)) states that external pin 1 cannot be connected to internal signal a and to internal signal b at the same time. This second Boolean expression makes the connections 1a and 1b mutually exclusive.

If external pin 2 can similarly be multiplexed to internal signals a or b, this is represented by the similar Boolean expressions:
 2a OR 2b
 NOT (2a AND 2b)
For this example, suppose neither internal signal a or b may be multiplexed to multiple external pins at the same time. This condition provides these Boolean expressions:
 NOT (1a AND 2a)
 NOT (1b AND 2b)
Finding a set of choices meeting Boolean satisfiability means finding a set of values or 1a, 1b, 2a and 2b (true or false) such that all of the above Boolean expressions are true. The expressions of this example are very trivial, but this example shows how the device capabilities are represented as Boolean expressions.

The designer's needs may also be formed a Boolean expressions. For example, suppose the needs require internal signal a to be pinned out to 1 or 2. The Boolean expression for this need is:
 1a OR 2a
The technique of this invention is more powerful than this simple example. Instead of asking for a specific signal to be output, the designer can specify that any one of several signals of some type (GPIO, timer etc.) to be output. This technique enables finding one signal of that type that can be output under the limitations of the individual multiplexers. If both signals a and b are the same type, and the designer needs one of that type, the Boolean expression is:
 1a OR 1b OR 2a OR 2b.
As a further example, the designer may need a group of related signals. For example, a UART module has both tx and rx signals and there are two UART modules on the system. The design may need "one uart." Let tx1 be the tx signal of the first UART, rx1 the rx signal of the first UART, and tx2 and rx2 the signals of the second UART, then the corresponding Boolean expressions are:
 1tx1 OR 2tx1 OR 1tx2 OR 2tx2
 1rx1 OR 2rx1 OR 1rx2 OR 2rx2
In this example the design requires the tx signal and the rx signal from the same UART. Therefore this example requires Boolean expressions to indicate the tx and rx signals must be from the same UART. If we let uart1 and uart2 to be the choice of using a specific UART, we get the following expressions:
 uart1 OR uart2
This means the system must choose one of the two UARTs.
 NOT (uart1 and uart2)
This means the system cannot choose both UARTs. These two Boolean expressions combined require the system to use one and only one UART. A further requirement is expressed as:
 uart1 OR NOT (1tx1 OR 2tx1 OR 1rx1 OR 2rx1)
The system must choose uart1 or not choose any of its pins. In addition:
 uart2 OR NOT (1tx2 OR 2tx2 OR 1rx2 OR 2rx2)
The system must choose uart2 or not choose any of its pins.

These were simple example the show how to describe design needs as Boolean expressions. Real-life designs are typically more complicated. Firstly, there may be timing constraints. For instance if signal a can be pinned out to external pins 1 and 2 and signal b can be pinned out to external pins 1, 2, 3, and 4, there may be a constraint that if signal a is on pin 1, signal b can only be on pins 2 and 4 and if signal a is on pin 2, then signal b can only be used on pins 1 and 3. There will typically by many requirements of this type. Secondly, each external pin can typically be assigned to more than two signals and each signal can typically be assigned to more than two pins. Thus an actual design need could be more complex that these simple examples. In the UART example above the design need was uart1 or usrt2. A more typical design need is any 3 of the 5 available UARTS. Thus UARTS may not be completely mutually exclusive of each other but related signals must still be groups.

Lastly, the Boolean satisfiability algorithms typically work in conjunctive normal form (CNF) Boolean expressions. A CNF expression can only use ORs and NOTs and cannot use ANDs or parentheses. Boolean algebra shows that any Boolean expression can be represented in CNF but it can get very complicated. For example, the expression NOT (1b AND 2b) could be represented as two expressions: NOT 1b OR 2b as well as 1b OR NOT 2b. Expressing three AND choices instead of two, requires six expressions. This grows exponentially with the number of possible choices making the Boolean expressions difficult to generate.

This invention has the following advantages. The ability to quickly, automatically and deterministically find a solution, or prove that a solution does not exist, is the main advantage. With the old tools, users would often spend days doing trial and error to find a valid solution.

FIG. 1 illustrates an example of the physical aspects of integrated circuit 100 of this invention. FIG. 1 schematically illustrates chip exterior 101 and chip interior 103. Exterior lines 111 to 119 represent integrated circuit 100 external electrical connections commonly embodied by exterior package pins (not illustrated). Exterior lines 111 to 119 are illustrated as crossing between chip exterior 101 to chip interior 103 and multiplexer 120. Multiplexer 120 also connects to interior lines 131 to 154. Interior lines 131 to 154 connect to various circuits disposed on the semiconductor of integrated circuit 100 (not shown). Multiplexer 120 is configured to interconnect exterior lines 111 to 119 and interior lines 131 to 154. Note that this invention handles both input (signals from exterior pins to interior connections) and output (signal form interior connections to exterior pins).

As shown in the example of FIG. 1, multiplexer 120 includes individual multiplexers 121 to 129. Multiplexer 121 enables connection between interior lines 131, 132, 133 and 142 and exterior line 111. Multiplexer 122 enables connection between interior lines 132, 141, 142 and 144 and exterior line 112. Multiplexer 129 enables connection between interior lines 151, 152, 153 and 154 and exterior line 119. FIG. 1 is an example only. The multiplexer of this invention may include more or fewer exterior lines, more of fewer individual multiplexers and more or fewer interior lines.

There are many options for the configuration of multiplexer 120. In some embodiments an individual exterior line 111 to 119 may connect to plural interior lines 131 to 154. In some embodiments individual interior lines 131 to 154 may connect to plural exterior lines 111 to 119. The number of exterior lines 111 to 119 need not equal the number of interior lines 131 to 154. In a typical embodiment the number of interior lines will exceed the number of exterior lines. Multiplexer 120 will typically not be capable of making all possible connections between exterior lines 111 to 119 and interior lines 131 to 154. Thus multiplexer 120 may not be capable of connecting some exterior lines 111 to 119 to some interior lines 131 to 154. In some embodiments multiplexer 120 may be fixed in manufacture and not changeable once constructed. In other embodiments multiplexer 120 may be alterable in whole or in part following construction of integrated circuit 100.

Figure 2:
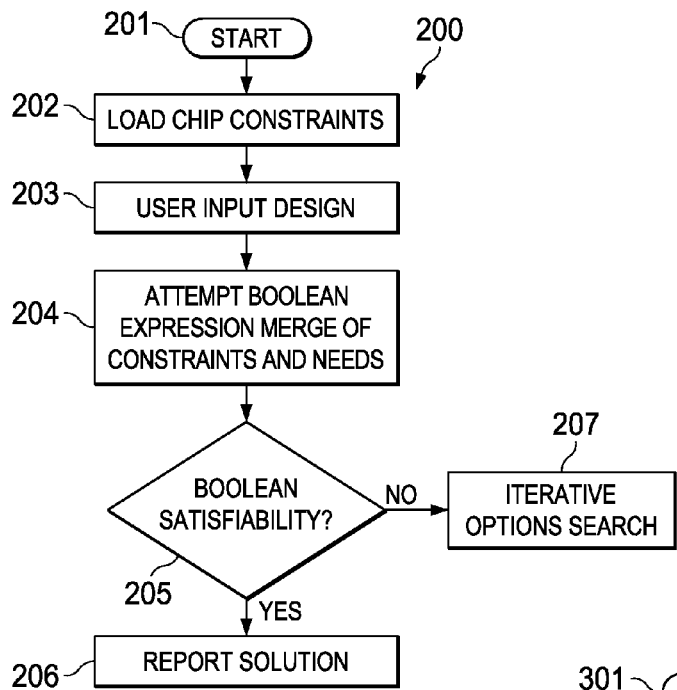
FIG. 2 illustrates a program flow diagram of an embodiment of this invention.

FIG. 2 illustrates a flow chart of a computer program 200 of this invention. Computer program 200 is executed by an appropriately programmed general purpose computer. The computer executing computer program 200 is not limited except by practicality. The computer must be capable of receiving the inputs noted below and generating an output useable by the designer. As noted below this output may include the configuration of multiplexer 110 to connect exterior lines 101 and interior lines 103 in a manner desired by the designer. The computer executing computer program 200 should have sufficient computational capacity to perform the needed functions in a reasonable amount of time.

Computer program 200 begins with start block 201. Next block 202 loads the multiplexer constraints. Multiplexer constraints are the limitations upon the connectively of multiplexer 110. As noted above multiplexer 110 may not be able to connect all external lines 111 to all internal lines 113. Block 202 receives Boolean equations that define the limitations on multiplexer 110. It is assumed that the limited connectivity of multiplexer 110 is known and can be expressed as Boolean equations.

Block 203 inputs the user design needs of the integrated circuit under design. The designer inputs the desired connection between external lines 111 and internal lines 113. As noted above, some internal lines 113 may connect to plural external lines 111 and some external lines 111 may connect to plural internal lines 113. In addition, not all external lines 111 or all internal lines 113 need be connected. In the preferred embodiment, these design needs are also expressed as Boolean equations.

In block 204 computer program 200 attempts to solve the Boolean expressions of constraints and needs. This is achieved by determining whether the set of Boolean expressions are consistent, that is they can all be true simultaneously. Boolean satisfiability, or finding a set of assignments to variables in a Boolean expression that would make the expression true, is a well studied problem in computer science. Block 204 may use a known algorithm for this domain to either prove that the expression can't be satisfied, or to find a set of assignments to the enumerated variables that would satisfy the expression. This set of assignments translates back into which signals to connect to which pins for the needs of this specific system. This is equivalent to determining that the design needs can be achieved by the constrained multiplexer. This converts what had been a cut-and-try solution to a known problem type with a known solution type.

Test block 205 determines whether block 204 found Boolean satisfiability. If so (Yes at test block 205), then the connection problem is solved. Block 206 generates a report. The Boolean variables providing Boolean satisfiability can be translated to control singles for multiplexer 110 to provide the connectivity desires. Note that Boolean satisfiability guarantees the connectivity problem has a solution. Program 200 ends with this report.

If test block 205 determines that no Boolean satisfiability is found (No at text block 205), then program 200 proceeds to block 207 to perform an iterative options search.

Figure 3:
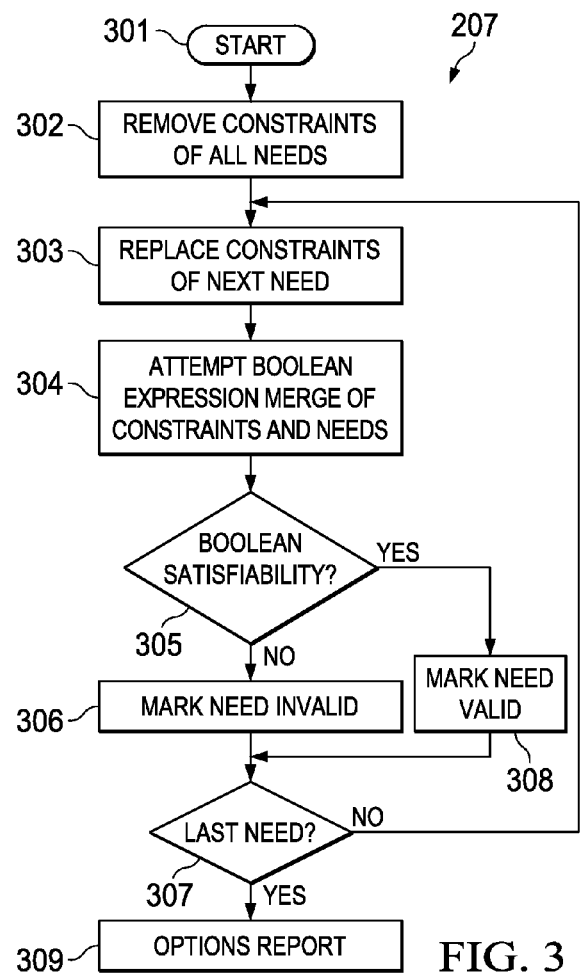
FIG. 3 illustrates a program flow diagram of an iterative options search according to this invention.

FIG. 3 illustrates a flow diagram of an embodiment of iterative options search 207. Iterative options search 207 begins with start block 301. Iterative options search 207 is only entered upon failure of the initial Boolean satisfiability attempt of block 204. Block 302 removed the constraints within all design needs.

Block 303 replaces the constraints of the next need. For the first instance of block 303, the next need is the first need in an ordered list. This ordered list will typically require input by the designer. The designer orders needs in criticality order from the most critical to the least critical. In other embodiments this ordering is arbitrary.

Block 304 attempts to solve the Boolean expressions of constraints and needs in the same manner as block 204. Test block 305 determines whether block 304 found Boolean satisfiability. If not (No at test block 305), then block 306 marks the current need as an error (unable to be satisfied). If this is not the last need (No at test block 307), then flow proceeds to block 303 to consider the next need.

If test block 305 determines block 304 found Boolean satisfiability (Yes at test block 305), then block 308 marks the current need as valid (can be satisfied). If this is not the last need (No at test block 307), then flow proceeds to block 303 to consider the next need.

If test block 307 determines the current need is the last need (Yes at test block 307), then all options have been considered. Block 30 generates an options report. This options report includes any Boolean satisfiability or not satisfiability reported in blocks 306 and 308. The options report indicates which combinations are not feasible and which may be satisfied with particular relaxed constraints. The integrated circuit designer employs this options report to determine how to proceed with the design.

The task of determining multiplexer controls for an integrated circuit is engineering. Engineering is the art of the possible. Engineering will often require a compromise between the original design desired and the achievable results. The ability to quickly, automatically and deterministically find a solution or prove that a solution does not exist is a great advantage in this exercise in the possible.

What is claimed is:

1. A signal input/output design method comprising the steps of:
    generating a first set of Boolean expressions indicating the connectivity capacity of at least one multiplexer to connect internal signals to external lines;
    receiving from a designer a desired connectivity between internal signals and external lines;
    employing a suitably programmed general purpose computer to convert said received desired connectivity between internal signals and external lines into a corresponding second set of Boolean expressions;
    employing a suitably programmed general purpose computer to determine whether said first set of Boolean expressions and said second set of Boolean expressions are Boolean satisfiable; and
    if said first set of Boolean expressions and said second set of Boolean expressions are not Boolean satisfiable
        removing all of said second set of Boolean expression, iteratively
        replacing related Boolean expressions of said second set of Boolean expressions, and
        employing the suitably programmed general purpose computer to determine whether said first set of Boolean expressions and a currently replaced second set of Boolean expressions are Boolean satisfiable, and
    reporting which related Boolean expressions of said second set are Boolean satisfiable and which are not Boolean satisfiable.

2. The signal input/output design method of claim 1, further comprising the step of:
    if said first set of Boolean expressions and said second set of Boolean expressions are Boolean satisfiable, generating set of control signals for the at least one multiplexer to connect internal signals to external lines according to the desired connectivity within the connectivity capacity of the at least one multiplexer.

3. The signal input/output design method of claim 2, further comprising the steps of:
    constructing an integrated circuit having the at least one multiplexer of the connectivity capacity; and
    controlling the at least one multiplexer with set of control signals to the desired connectivity between internal signals and external lines.

4. The signal input/output design method of claim 3, wherein:
    said controlling step occurs once upon manufacture of the integrated circuit and is fixed thereafter.

5. The signal input/output design method of claim 3, wherein:
    the integrated circuit has more than one desired connectivity between internal signals and external lines; and
    said controlling step operates once each change from a first desired connectivity to a second desired connectivity.

6. The signal input/output design method of claim 1, further comprising the step of:
    receiving an ordered list of said second set of Boolean expressions from a designer; and
    wherein said step of iteratively replacing related Boolean expressions of said second set of Boolean expressions operates in an order of said ordered list of said second set of Boolean expressions.

* * * * *